United States Patent [19]

Heller

[11] 4,247,817

[45] Jan. 27, 1981

[54] TRANSMITTING ELECTRICAL SIGNALS WITH A TRANSMISSION TIME INDEPENDENT OF DISTANCE BETWEEN TRANSMITTER AND RECEIVER

[75] Inventor: Lawrence D. Heller, Watertown, Mass.

[73] Assignee: Teradyne, Inc., Boston, Mass.

[21] Appl. No.: 905,732

[22] Filed: May 15, 1978

[51] Int. Cl.³ .................. G01R 31/28; H03K 5/159; H04B 3/00

[52] U.S. Cl. ................. 324/73 R; 307/354; 328/56; 333/136

[58] Field of Search ............ 324/52, 51, 188, 73 R, 324/73 AT, 73 PC; 340/167 B, 169, 172; 333/20, 136; 307/228, 293, 354, 355; 328/55, 56, 129, 135, 147

[56] References Cited

U.S. PATENT DOCUMENTS

| | | | |
|---|---|---|---|
| 3,031,643 | 4/1962 | Sheftelman | 324/52 X |
| 3,068,405 | 12/1962 | Glazer et al. | 324/188 |
| 3,204,180 | 8/1965 | Bray et al. | 324/188 |
| 3,243,665 | 3/1966 | Fayer et al. | |
| 3,348,141 | 10/1967 | Jensen et al. | 324/188 X |
| 3,377,518 | 4/1968 | Radcliffe | |
| 3,585,500 | 6/1971 | Grubel | 324/188 X |
| 3,760,261 | 9/1973 | Collins | |
| 4,063,080 | 12/1977 | Eichelberger | 324/73 AT X |

OTHER PUBLICATIONS

Bachman et al., *Precision Delay Line*, IBM Technical Disclosure Bulletin, vol. 9, No. 10, Mar. 1967, p. 1300.

*Primary Examiner*—Gerard R. Strecker

[57] ABSTRACT

Two time varying signals are transmitted in opposite directions over transmission means between signal generator means and a signal receiver. The signal receiver includes means for sensing when the combination of signals arriving at the receiver reaches a predetermined trigger state, and the generator means includes means for causing the signals to vary with time in a manner selected to cause the signal combination to reach the trigger state at a time dependent upon the length of the transmission means but independent of the distance between the generator and receiver.

15 Claims, 12 Drawing Figures

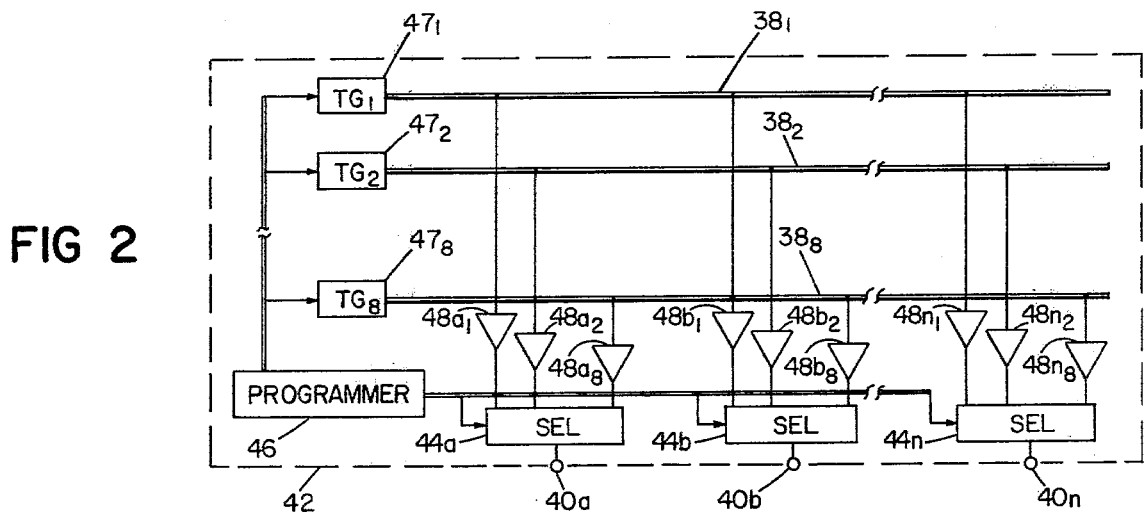
FIG 2
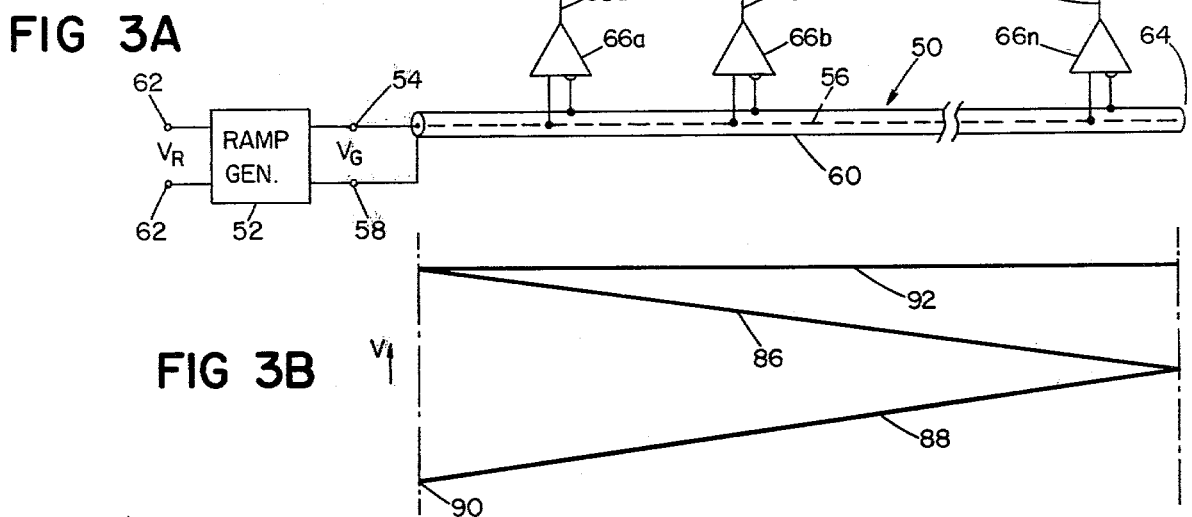
FIG 3A
FIG 3B
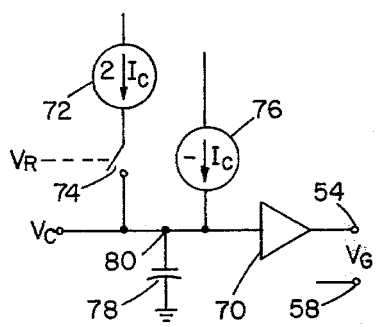
FIG 4
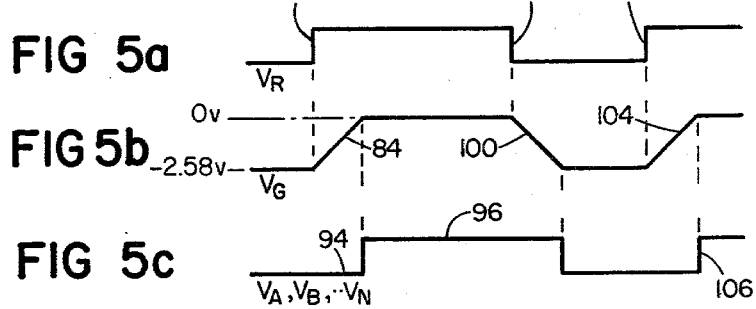
FIG 5a
FIG 5b
FIG 5c

TRANSMITTING ELECTRICAL SIGNALS WITH A TRANSMISSION TIME INDEPENDENT OF DISTANCE BETWEEN TRANSMITTER AND RECEIVER

BACKGROUND OF THE INVENTION

This invention relates to sending electrical signals along a transmission line to trigger a receiver at a time independent of the relative positions of the signal source and the receiver along the line.

It is often desirable to simultaneously trigger a number of receivers spaced along a transmission line. But, because of signal propagation delay times, a signal sent along the line from one end will reach the receivers at different times. In a high speed digital board tester, for example, multiple units are simultaneously tested and there must be precise synchronism of driver transitions applied to each of the units under test, as such driver transitions must change at specified times. Similarly, detection windows must be accurately synchronized as signals coming from the units under test to the tester detectors are expected to be valid for precise time intervals. Such testers operate at high speeds, up to 10 megahertz or more, and the signal transmission time along the back plane may be several nanoseconds as such back planes may be five feet or more in length. Signal propagation delay times in such systems are significant where signal synchronization tolerances in the order of ±5 nanoseconds or less are involved.

SUMMARY OF THE INVENTION

In general, the invention features transmitting two signals to a receiver in opposite directions along a transmission line, and causing the signals to vary with time in a manner selected to cause the combination of signals arriving at the receiver to reach a predetermined trigger state at a time dependant upon the length of the transmission line but independent of the distance between the generator and receiver. In preferred embodiments, the signals vary linearly with time; the transition (rise or fall) time of the signal is at least equal to the time for an electrical signal to propagate the length of the line; and multiple receivers, each with the same trigger state, are triggered simultaneously.

In a high speed digital board tester timing signals are distributed to driver/detector boards in synchronism. Plural transmission systems each include a signal generator which drives a strip of metallization on the tester back plane that is designed to act like a transmission line. Two ramp waveforms propagate in opposite directions along the transmission line strip and a differential high impedance line receiver is triggered when the combined ramp signals reach a predetermined threshold state. Receivers that are connected to the same transmission line are triggered simultaneously and the resulting receiver outputs are selectively applied to tester terminals under programmer control. Timing signals are distributed to tester terminals in synchronism without variance due to the physical length of transmission path between each signal generator and each tester terminal.

In one particular embodiment, a ramp generator is connected at each end of an elongated transmission line. The two ramp generators are triggered simultaneously and after a time interval corresponding to the signal propagation time over the length of the transmission line, the combined ramp signal values at all points along the transmission line are the same, so that threshold responsive receivers may be triggered in synchronism. In another embodiment, a single ramp generator is employed with an open circuit terminated transmission line, and the receivers respond to the combined values of incident and reflected ramp signals. In still another embodiment, two parallel transmission lines are employed and comparators are connected between the two transmission lines. A ramp signal is transmitted over one transmission line and simultaneously an inversely related ramp signal is transmitted in the opposite direction over the other transmission line. The comparators respond to a predetermined difference between the two ramp signals and are triggered simultaneously. In still another embodiment, time of event information from a signal source of uncertain location is transmitted to a fixed destination over a loop transmission line with two parallel sections, the signal being transmitted in opposite directions over the two parallel sections.

DESCRIPTION OF PARTICULAR EMBODIMENTS

We now turn to the circuitry and operation of particular embodiments of the invention after first briefly describing the drawings.

Drawings

FIG. 2 is a diagram of a digital board tester in accordance with the invention;

FIG. 3A is a block diagram of another signal transmission system in accordance with the invention, and FIG. 3B is a voltage diagram illustrating voltage conditions on the transmission line shown in FIG. 3A at a particular instant in time;

FIG. 4 is a diagram of the ramp generator employed in the system shown in FIG. 3A;

Figure 6A:
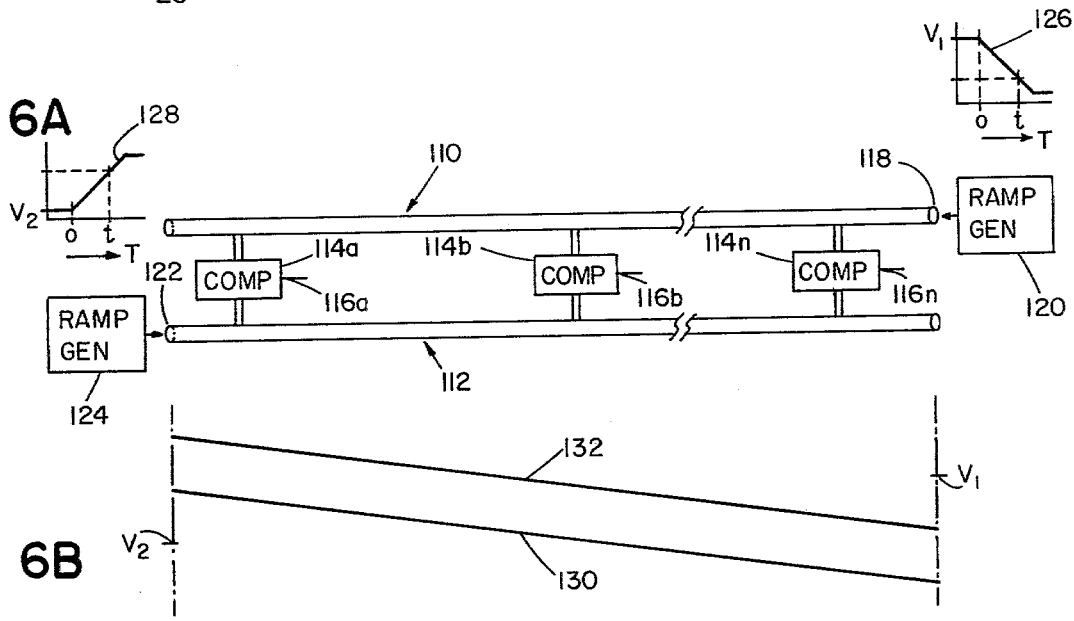
Figure 6B:
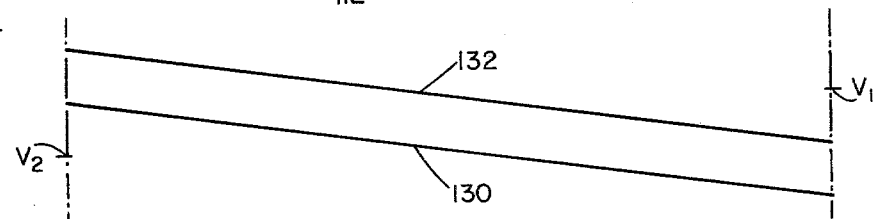
Figure 7:
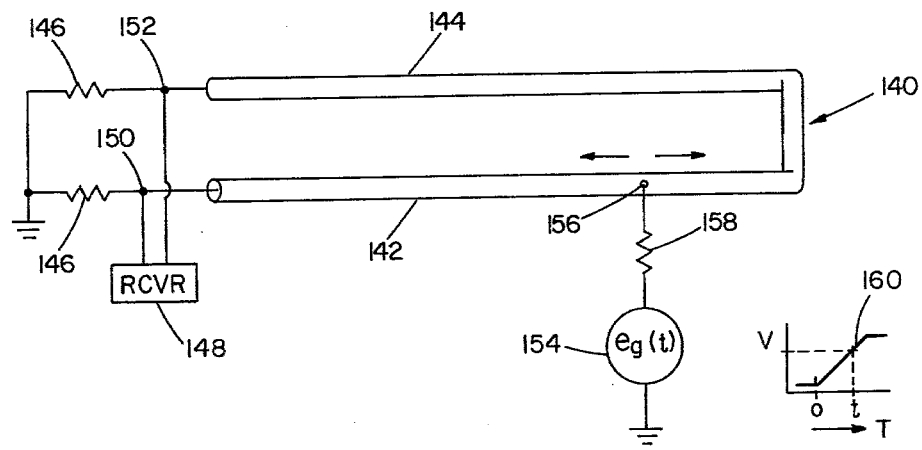

FIG. 5a–c are diagrams of waveforms in the system shown in FIG. 3A;

FIGS. 6A and 6B are a block diagram and a voltage diagram respectively of another embodiment of the invention; and FIG. 7 is a diagram of a system for transmitting time of event information from a source to a fixed destination.

CIRCUITRY AND OPERATION

Figure 1A:
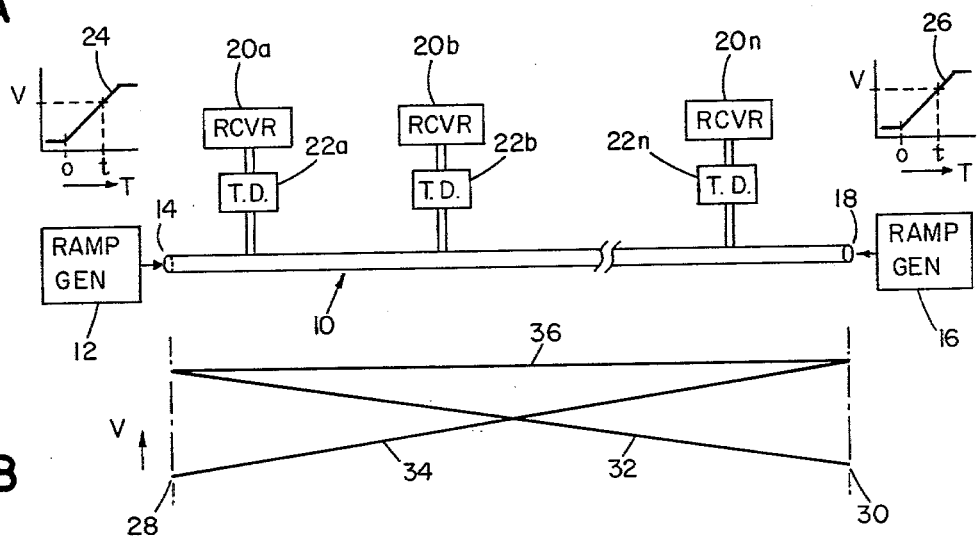
FIG. 1A is a block diagram of a signal transmission system in accordance with the invention.
Figure 1B:
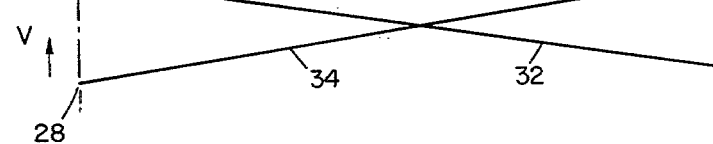
FIG. 1B is a voltage diagram illustrating voltage conditions on the transmission line shown in FIG. 1A at a particular instant in time.

With reference to FIG. 1, the signal synchronization system includes elongated electrical transmission line 10 (e.g., strip line, wave guide, or coaxial cable), with one ramp generator 12 connected to one end of line 10 at terminal 14 and a similar ramp generator 16 connected to the opposite end of line 10 at terminal 18. Receivers 20 are connected to line 10 at spaced points. It is desired that all receivers 20 be triggered simultaneously, even though the leading edge of any waveform introduced into either end of line 10 will reach different receivers 20 at different times. Each receiver 20 is connected to line 10 through a threshold detector 22. The ramp generators 12, 16 generate identical ramp waveforms 24, 26, and the two generators are triggered simultaneously (at time zero). The time interval (t) for each ramp 24, 26 to rise to voltage level V is equal to the time required for the leading edge of the ramp waveform to travel the full length of line 10. Each threshold detector 22 senses the sum of the voltages of the two ramps traveling in opposite directions along line 10. FIG. 1B shows the voltage condition at time t, when the leading edge 28 of ramp 26 has reached terminal 14 and the leading edge 30 of ramp 24 has reached terminal 18. The voltage condition along line 10 due to ramp 24 is represented by line 32 and the voltage condition along line 10 due to ramp 26 is represented by line 34. As can be seen graphically in FIG. 1B, the sum (as represented by line 36) of the voltages 32, 34 is now the same at all points along transmission line 10. After time t, each ramp waveform continues to rise towards its maximum voltage level and the combined voltage at any time during that interval is the same at all points along the transmission line. Each threshold detector 22 signals its receiver 20 the instant that the total voltage it sees on line 10 exceeds its threshold voltage so that all receivers 20 are triggered simultaneously.

Instead of a two ramp generator system, a transmission line with an open circuit termination can be employed so as to cause a reflected ramp waveform to travel back towards the source. A condition of voltage equality at all points along the line occurs when the leading edge of the reflected ramp waveform reaches the source end, after a delay of twice the signal propagation time along the transmission line. Eight open circuit terminated transmission lines 38 of that type are used to furnish timing signals to terminals 40 in the digital board tester system shown in FIG. 2. Each transmission line on the back plane mother board 42 may be a strip of metallization, which is designed to act like a transmission line. Selector circuitry 44 associated with each driver/detector terminal 40 as controlled by programmer 46 selects one of the transmission lines 38 to furnish a timing signal during a particular test. Programmer 46 also triggers the ramp generators 47 in a controlled manner to determine the phase and duration of the timing signal furnished by each line 38. Connected between each selector 44 and the set of transmission lines 38 are a set of differential high impedance line receivers 48. Each receiver 48 is triggered by a predetermined signal value that occurs during the condition of voltage equality along its line 38 and the resulting receiver output transition, as selected by selector 44, is applied to its tester terminal 40. The system essentially eliminates the effect of back plane delay and allows interchange of driver/detector boards without calibration or introduction of error.

Shown in FIG. 3 is a single line system of the type shown in FIG. 2 that responds to a combination of incident and reflected ramp waveforms. Transmission line 50 (e.g., type RG58C/U coaxial cable with 50 ohms characteristic impedance ($Z_0$) and a signal propagation velocity of 0.678 feet per nanosecond) is ten feet in length. Ramp generator 52 has terminal 54 connected to inner conductor 56 of cable 50 and terminal 58 connected to shield 60. Generator 52 has TTL compatible input terminal 62, to which control signal $V_R$ is applied. The end 64 of transmission line 50 opposite terminals 54, 58 is open circuit terminated. Connected to line 50 with minimum length stubs at spaced points along its length are ECL type 10115 line receivers 66, each of which has output line 68.

Ramp generator 52 is of the form shown in FIG. 4 and includes voltage follower 70 of high input impedance and of $Z_0$ output impedance; current source 72 connected to switch 74 controlled by timing voltage $V_R$; current source 76; and capacitor 78 connected to integrating node 80. When the switched source 72 is connected in circuit, capacitor 78 is charged by the current $I_C$ so that node 80 swings from a low voltage $V_L$ to voltage $V_H$ at a slew rate of $I_C/C$ volts/nanosecond (where C is in picofarads and $I_C$ is in milliamperes). When switched source 72 is disconnected from the circuit, capacitor 78 is charged by the current $-I_C$ so that node 80 swings from $V_H$ to $V_L$ at a slew rate of $-I_C/C$ volts/nanosecond. The rise time of ramp generator 52 is correlated with the length of transmission line 50 and the time for the ramp waveform to swing from a reference value to a trigger or threshold value of the receivers 66 is at least twice the time required for the signal to propagate the length of line 50. Thus, in this embodiment, the rise time of the ramp waveform produced by generator 52 from its reference value to its trigger value is 29.5 nanoseconds.

With reference to FIG. 5, positive $V_R$ transition 82 (FIG. 5a) closes switch 74 to initiate generation by ramp generator 52 of the ramp 84 (FIG. 5b) that rises from a $-2.58$ volt reference level to zero volts in 29.5 nanoseconds. Each receiver 66 has a threshold or trigger voltage of $-1.29$ volts. FIG. 3B represents the voltage condition on line 50, 29.5 nanoseconds after transition 82 triggers ramp generator 52. That voltage condition is composed of incident ramp voltage 86 and reflected ramp voltage 88, the leading edge 90 of reflected ramp 88 just having reached terminal 54. As indicated in FIG. 3B, the sum 92 of the incident and reflected ramp voltages at that time is $-1.29$ volts at all points along the length of line 50. Receivers 66 are triggered at that time causing the voltages on their output lines 58 to switch from level 94 to level 96 (FIG. 5c).

A negative going $V_R$ transition 98 opens switch 74 so that ramp generator 52 produces ramp 100 (FIG. 5b). That negative going ramp returns to the $-2.58$ reference voltage in 29.5 nanoseconds and the outputs of the line receivers 66 switch back to level 94 at that time. In response to a positive going $V_R$ transition 102, ramp generator 52 generates positive ramp 104 and the outputs of line receivers 66 are switched in synchronism at transition 106 (FIG. 5c) to level 96.

With reference to FIG. 6, another synchronization system utilizes two parallel transmission lines 110, 112 with comparators 114 connected to produce outputs on lines 116 when the voltages on the two transmission lines 110, 112 are equal or in other predetermined relation. Connected to terminal 118 of line 110 is ramp generator 120 and connected to terminal 122 of line 112 is ramp generator 124. Initially, the voltage on line 110 is maintained at value $V_1$ and the voltage on line 112 is maintained at the value $V_2$. Both ramp generators 120, 124 are triggered simultaneously, ramp generator 120 generating a negative going ramp 126 and ramp generator 124 generating a mirror image or complementary positive going ramp 128. FIG. 6B indicates the voltage conditions on lines 110, 112 at time t—equal to the signal propagation time on line 110 or line 112. At that time the differences in the voltages on the two lines 110, 112 are the same at all points along the length of the lines, the voltage due to ramp waveform 126 being indicated at 130 and the voltage due to ramp waveform 128 being indicated at 132. Thereafter, for the duration of the ramp interval, this condition of voltage correspondence along the lengths of the two lines remains in existence and the comparators are triggered simultaneously when the voltage differences between the two lines reaches the preset comparator trigger value.

The embodiment shown in FIG. 7 is a system for transmitting time of event information over a transmission line from a source whose position on the transmission line is uncertain (not known or variable) to a fixed and known destination without introducing error or uncertainty due to the distance of the source from the destination. The transmission line 140 is in the form of a loop and has two parallel sections 142, 144, each section being terminated in its characteristic impedance 146. Receiver 148 is connected across line terminals 150, 152. The signal source 154 is connected to line 142 at point 156 through matching impedance 158.

Source 154 produces a time varying signal (e.g., voltage ramp 160) which produces two traveling waves in line 140, one of which travels along line section 142 towards terminal 150 and the other of which travels in the opposite direction and along line section 144 towards terminal 152. Receiver 148 responds to the sum of the two traveling waves sensed at terminals 150, 152 and is arranged to be triggered at a threshold voltage equal to or greater than the value V of signal 160 after a time interval equal to the signal propagation time over line 140 from terminal 150 to terminal 152 (time t). After time t, the voltage sum sensed by receiver 148 is independent of the location of source 154. As the trigger voltage of receiver 148 is equal to or in excess of voltage V, the time that receiver 148 is triggered is precisely related to the time source 154 is triggered and independent of the location of that source on transmission line 140.

Other embodiments are within the following claims.

I claim:

1. A signal transmission system comprising
   transmission line means,
   at least one receiver connected to said line means, and
   signal generator means connected to said line means
     for transmitting first and second ramp-shaped electrical signals to said receiver along respective first and second, oppositely-directed paths,
     the maximum distance along said line means between a said receiver and signal generator means defining a full length for said line means,
     said receiver comprising means for sensing when the combination of said first and second signals arriving at said receiver reaches a predetermined trigger state,
     each of said first and second ramp-shaped signals varying progressively with time through a range of levels between a first level and a second level, said variation initiating at a leading edge, and
     the rate of said progressive variation being selected so that said variation continues over a time period greater than the time required for the leading edge of the respective signal to propagate along said full length of said line, and so as to cause said signal combination to reach said trigger state at a time independent of the relative positions of said receiver and said signal generator means along said line means.

2. The system as claimed in claim 1 wherein said receiver includes means for sensing said signal combination in additive relation.

3. The system as claimed in claim 1 wherein said receiver includes comparator means for sensing said signal combination.

4. The system as claimed in claim 1 wherein a plurality of said receivers are connected to said line means at points spaced therealong, and the trigger state response of each said receiver is the same whereby all of said receivers respond to said signal combination at the same time.

5. The system as claimed in claim 1 wherein said receiver is at one end of said line means.

6. The system as claimed in claim 1 wherein said line means is a coaxial cable and said receiver is connected to the sheath and center conductor of the coaxial cable such that spurious reflections are minimized.

7. The system as claimed in claim 1 wherein said progressive variation is linear with time.

8. The system as claimed in claim 1 wherein said generator means includes a signal generator at one end of said line means and the other end of said line means is open circuit terminated whereby said first signal is generated at said one end by said generator and said second signal is a reflection of said first signal and emanates from said other end.

9. The system as claimed in claim 1 wherein said generator means includes a signal generator at each end of said line means, and further including means for triggering said signal generators simultaneously to transmit said electrical signals in opposite directions along said line means.

10. The system as claimed in claim 9 wherein said line means includes two parallel transmission lines, said receiver includes a comparator connected between said parallel lines, and the electrical signal generated by said second signal generator is the mirror image of the electrical signal generated by said first signal generator.

11. The system as claimed in any one of claims 1, 8 or 9 wherein said electrical signals transmitted by said generator means along said line means vary linearly with time, a plurality of receivers are connected to said line means at points spaced therealong, and the trigger state response of each said receiver is the same whereby all of said receivers respond to said signal combination in synchronism.

12. A digital board tester comprising a plurality of signal transmission systems as claimed in claim 11, each said transmission system including a said signal generator means, an elongated transmission line extending along the length of a tester support plane and at least one said receiver, a plurality of tester terminals, selector means for selecting a signal transmission system, and a programmer for triggering said generator means and for controlling said selector means to distribute timing signals to said tester terminals.

13. The system as claimed in claim 1 wherein said line means is in a loop, said receiver is connected to the ends of said line and said generator means is connected at a point intermediate the ends of said line.

14. A digital board tester comprising a plurality of signal transmission systems as claimed in any one of claims 8 or 1, each said transmission system including a said signal generator means, an elongated transmission line extending along the length of a tester support plane and at least one said receiver, a plurality of tester terminals, selector means for selecting a signal transmission system, and a programmer for triggering said generator means and for controlling said selector means to distribute timing signals to said tester terminals.

15. The tester as claimed in claim 14 wherein a plurality of said receivers are connected to each said elongated transmission line at points spaced therealong, and the trigger state response of all the receivers connected to any one transmission line is the same whereby all of the receivers connected to that line respond to said signal combination at the same time, and said selector means selects receiver output signals for application to the tester terminals.

* * * * *